United States Patent
Lee et al.

(10) Patent No.: US 6,785,171 B2
(45) Date of Patent: Aug. 31, 2004

(54) SEMICONDUCTOR MEMORY DEVICE

(75) Inventors: Hi-Choon Lee, Kyunggi-do (KR); Byoung-Ju Kim, Seoul (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/237,665

(22) Filed: Sep. 10, 2002

(65) Prior Publication Data

US 2003/0048678 A1 Mar. 13, 2003

(30) Foreign Application Priority Data

Sep. 11, 2001 (KR) ........................................ 2001-55949

(51) Int. Cl.[7] .................................................. G11C 7/00
(52) U.S. Cl. .................................... 365/200; 365/225.7
(58) Field of Search ............................ 365/200, 225.7, 365/185.09, 230.03, 230.06, 189.07

(56) References Cited

U.S. PATENT DOCUMENTS

| | | | |
|---|---|---|---|
| 6,272,057 B1 * | 8/2001 | Koshikawa | 365/200 |
| 6,377,498 B1 * | 4/2002 | Kang | 365/200 |
| 6,421,285 B2 * | 7/2002 | Matsuzaki et al. | 365/200 |
| 6,621,750 B2 * | 9/2003 | Okuyama et al. | 365/200 |

FOREIGN PATENT DOCUMENTS

| | | |
|---|---|---|
| JP | 07-182892 | 7/1995 |
| JP | 08-340089 | 12/1996 |
| JP | 10-308091 | 11/1998 |
| JP | 10-320979 | 12/1998 |

* cited by examiner

Primary Examiner—Tan T. Nguyen
(74) Attorney, Agent, or Firm—Volentine Francos, PLLC

(57) ABSTRACT

A semiconductor memory device includes a plurality of sub-wordlines, a plurality of sub-wordlines corresponding a redundancy main wordline, a plurality of redundancy memory cells each being coupled to each of the redundancy sub-wordlines, and a redundancy control circuit for disabling the main wordline selector when among the sub-wordlines, a sub-wordline to which a defective memory cell is coupled is addressed, and for controlling the sub-wordline to be replaced by the redundancy main wordline. The number of the redundancy sub-wordlines coupled to the redundancy main wordline is smaller than the number of the sub-wordlines coupled to the main wordline. Therefore, when among the sub-wordlines coupled to the main wordline, a sub-wordline to which a normal main memory cell is coupled is addressed, the main wordline selector is enabled to improve a redundancy flexibility and reduce a circuit area.

9 Claims, 6 Drawing Sheets

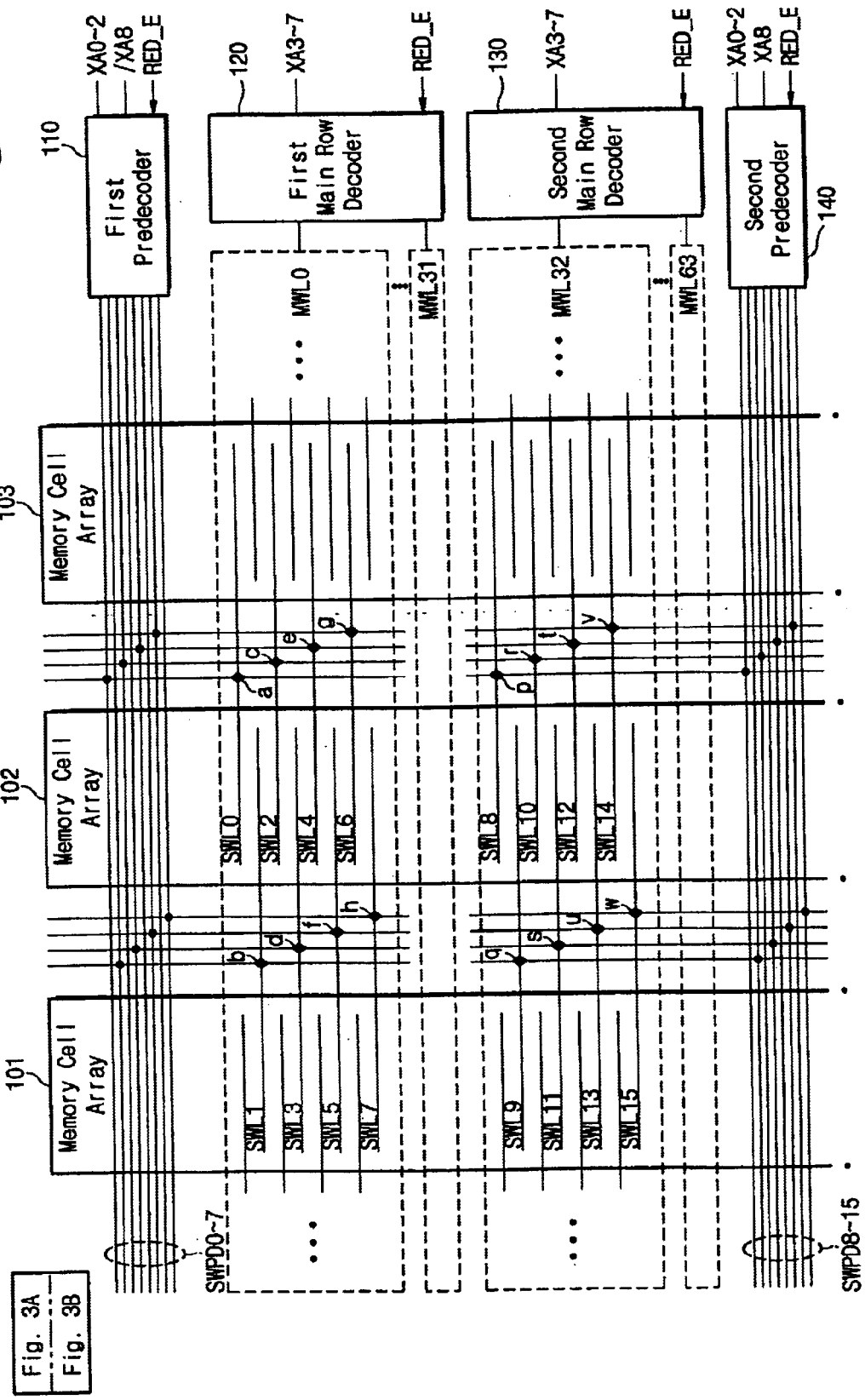

SEMICONDUCTOR MEMORY DEVICE

CROSS REFERENCES TO RELATED APPLICATIONS

This application relies for priority upon Korean Patent Application No. 2001-55949, filed on Sep. 11, 2001, the contents of which are herein incorporated by reference in their entirety.

FIELD

The present invention relates to a semiconductor memory device having a redundancy function. Also the invention relates to a semiconductor memory device to enhance a data access speed.

BACKGROUND

As a memory unit, a memory cell must stably store data that is processed in a system. Accordingly, there is a requirement for a procedure to test respective memory cells.

A redundancy circuit is a spare circuit, built into a memory device, for replacing defective cells with redundant memory cells. When an external address addressing a defective cell is input, the redundancy circuit disables a wordline organically connected to the defective cell and accesses a redundancy memory cell corresponding to the defective cell.

A semiconductor memory device must have a function to be instantly responsive to a central processing unit (CPU) speed, which is the most ideal requirement of system users. What is needed for having that function is to reduce the load of respective signal lines for transmitting a data access signal. Japan Laid-Open Application No. 7-182892 (filed on Dec. 22, 1993) discloses a semiconductor memory device having a hierarchical row decoder coupled to a main wordline, which can repair a defect without an increase in the number of redundancy main wordlines and occupy a minimal circuit area. Japan Laid-Open Application No. 8-340089 (filed on Mar. 2, 1995) discloses a DRAM device which can achieve a high speed by lowering the resistance of metal interconnections. Japan Laid-Open Application No. 10-308091 (filed on Mar. 2, 1997) discloses a semiconductor memory device which can suppress increase in the power consumption and achieve a high speed and a smaller occupied area while keeping the advantages of a hierarchical wordline. Japan Laid-Open Application No. 10-320979 (filed on Apr. 14, 1998) discloses a semiconductor memory device which can enhance a transmission speed and improve an integration level by shortening interconnections. U.S. Pat. No. 5,764,585 (filed on Jun. 7, 1996) discloses a DRAM device having a plurality of main row decoders each being coupled to one main wordline, and a plurality of sub-row decoders each being coupled to the one main wordline and a plurality of sub-wordlines, which can enhance an access speed of the device by reducing the load of the main row decoders. These above prior art devices are oriented toward a high speed by improving a chip layout, Referring now to FIG. 1, a conventional DRAM device includes a plurality of memory cell arrays 10, 12, and 14 having a plurality of memory cells, a main row decoder 16, a plurality of main wordlines MWL0–MWL63, a predecoder 30, an address program circuit 32, a redundancy main wordline RMWL, sub-row decoders ah, and redundancy sub-row decoders i–p. Now, wordlines crossing over a plurality of memory cell arrays and their drivers are described in detail below. For reference, an external address used in the following discussion is XA0–XA8.

The main row decoder 16 activates one of 64 main wordlines MWL0–MWL63 according to an external row address XA3–XA8. Each of the main wordlines MWL0–MWL63 is connected to one side of the main row decoder 16 and is horizontally arranged over the memory cell arrays 10, 12, and 14. Each of sub-row decoders a, c, e, and g is disposed between the memory cell arrays 12 and 14, and is connected to a main wordline through a corresponding one of sub-wordlines SW0, SW2, SW4, and SW6 crossing over the memory cell array 12 and 14. Each of sub-row decoders b, d, f, and h is disposed between the memory cell arrays 10 and 12, and is connected to a main wordline through a corresponding one of sub-wordlines SW1, SW3, SW5, and SW7 crossing over the cell arrays 10 and 12.

The predecoder 30 activates one of eight predecoding lines SWPD0–SWPD7 according to an external row address XA0–XA2. Each of the predecoding lines SWPD0–SWPD7 is horizontally arranged over the memory cell arrays 10, 12, and 14 and is vertically arranged therebetween, coupling each of corresponding sub-row decoders a–h to one side of the predecoder 30. In other words, each of the predecoding lines SWPD0–SWPD7 is coupled to 64 sub-row decoders.

The address program circuit 32 receives the same address XA3–XA8 as an external address inputted to the main row decoder 16 during a repair operation, activating a redundancy main wordline RMWL. The redundancy main wordline RMWL is coupled to one side of the address program circuit 32 and is horizontally arranged over the memory cell arrays 12–14. Each of redundancy sub-row decoders i, k, m, and l is disposed between the memory cell arrays 12 and 14, and couples a corresponding one of redundancy sub-wordlines RSWL0, RSWL2, RSWL4, and RSWL 6 to the redundancy main wordline RMWL. Each of redundancy row decoders j, l, n, and p is disposed between the memory cell arrays 10 and 11, and couples a corresponding one of redundancy sub-wordlines RSWL1, RSWL3, RSWL5, and RSWL7 to the redundancy main wordline RMWL.

The operations of the above semiconductor memory device are now described in detail. Each of the main wordlines MWL0–MWL63 is activated according to the combination of external row addresses XA3–XA8. For example, when all external row addresses XA3–XA8 inputted to the main row decoder 16 are '0' (i.e., '000000'), only the main wordline MWL0 is activated and the others, MWL1–MWL63, are inactive.

The predecoder 30 activates one of eight predecoding lines SWPD0–SWPD7 according to an external row address XA0–XA2. For example, when all row addresses XA0–XA2 are '0' (i.e., '000'), the predecoding line SWPD0 is activated and the other predecoding lines SWPD1–SWPD7 are inactive.

As previously described, each of the sub-row decoders a–h is coupled to one of the main wordlines MWL0–MWL63 through a corresponding sub-wordline. Therefore, each of the sub-row decoders a–h is activated when both a main wordline and a predecoding line, which are organically coupled to each other, are activated. As described in the example above, when the 0th main wordline MWL0 and the 0th predecoding line are activated, only the sub-row decoder "a" is activated. Therefore, the sub-row decoder "a" activates memory cells coupled to the sub-wordline SW0.

The most ideal case is that a predecoding signal on the predecoding line SWPD0 is supplied to only the sub-row decoder "a" coupled to the activated 0th main wordline MWL0. As shown in FIG. 1, however, the predecoding signal is supplied to all the sub-row decoders "a" coupled to the 63 main wordlines MWL1–MWL63 as well as the activated main wordline MWL0 (i.e., the predecoding signal is supplied to all the 64 sub-row decoders "a"), which becomes a load of the predecoding line SWPD0. From the standpoint of a signal, the data access signal on the predecoding line is subjected to a considerable physical resistance when it is supplied to the final cell. Therefore, the data access speed of the conventional memory device is reduced.

A repair is needed when a defective cell is created by various causes during a wafer fabricating process. When an external address for accessing a defective cell is inputted, a redundancy circuit disables a wordline coupled to a defective cell and enables a redundancy wordline. The conventional memory device of FIG. 1 carries out the repair with a main wordline unit. For example, when there are defective cells coupled to the sub-wordline SWL1 among cells in the memory cell array 12, operations of the memory device are described below.

As mentioned above, the sub-wordline SWL1 is activated when the main wordline MWL0 and the predecoding line SWPD1 are activated, i.e., an external address is '001000000'. Therefore, when an address XA0–XA8 (i.e., '001000000') for selecting a sub-wordline SWL1 coupled to a defective cell is inputted, an address program circuit 32 disables the main row decoder 16 and activates a corresponding redundancy main wordline RMWL and a predecoding line SWPD1. As a result, all memory cells coupled to the 0th main wordline MWL0 are replaced by a redundancy main wordline RWML.

FIG. 2 illustrates a partial circuit construction of a main row decoder 16 associated with a 0th main wordline MWL0 and a partial circuit construction of a predecoder 30 associated with a 0th predecoding line SWPD0.

Referring now to FIG. 2, an address program circuit 32 compares an externally inputted row address XA3–XA8 with an address stored therein. According to the comparing result, the address program circuit 32 generates a redundancy enable signal RED_E indicating a normal mode or a repair mode. That is, if the externally inputted row address XA3–XA8 match up to the address stored in the address program circuit 32, the control signal becomes high (i.e., logic '1') to enter a repair mode. Otherwise, the control signal becomes low (i.e., logic '0') to exhibit a normal mode.

Components for activating a 0th main wordline MWL0 in a main row decoder 16 are a decoder 40, an inverter 44, and a buffer 45. Since components for activating the other wordlines MWL1–MWL63 are identical to the components for activating the 0th main wordline MWL0, only a circuit construction associated with the 0th main wordline MWL0 is illustrated and described at this time. The decoder 40 has NAND gates 41–43 and outputs a signal for activating the 0th main wordline MWL0 when all the external row addresses XA3–XA8 are low (i.e., '000000') while a redundancy enable signal RED_E outputted from an address program circuit 32 is high. The buffer 45 converts the level of a signal outputted from the decoder 40 into the level suitable for driving the main wordline MWL0, and outputs the signal having the converted level.

Components for activating a 0th predecoding line SWPD0 in the predecoder 30 are an AND gate 51 and a buffer 52. Since components for activating the others SWPD0–SWPD7 are identical to the components for activating the 0th predecoding line SWPD0, only a circuit construction associated with the 0th predecoding line SWPD0 is illustrated and described at this time. The AND gate 51 outputs a signal for driving the predecoding line SWPD0 when the address XA0–XA2 is '000'. The buffer 52 converts the level of a signal outputted from the decoder 51 into the level suitable for driving the predecoding line SWPD0, and outputs the signal having the suitable level.

A buffer 60 converts the level of a redundancy enable signal RED_E outputted from the address program circuit 32 into the level suitable for driving the redundancy main wordline RMWL, and outputs the signal having the suitable level. Also the buffer 60 may be built in the address program circuit 32.

The conventional memory device having the foregoing structure carries out a normal mode when the control signal RED_E outputted from the address program circuit 32 is low. When the control signal RED_E is high, the conventional memory device carries out a repair mode where the redundancy main wordline RMWL is activated.

Unfortunately, even when only one of sub-wordlines coupled to one main wordline fails, all the sub-wordlines must be replaced by redundancy sub-wordlines in the repair mode. That is, a repair is performed with a wordline unit. Accordingly, a redundancy flexibility is reduced and a circuit area is increased.

SUMMARY

For the reasons stated above, and for other reasons stated below which will become apparent to those skilled in the art upon reading and understanding the present specification, there is a need for a semiconductor memory device which realizes a high-speed operation by alleviating the load of a predecoding line. There is also a need for a semiconductor memory device to enhance a redundancy flexibility. What is also needed is a semiconductor memory device where circuit areas are reduced.

Accordingly, a semiconductor memory device is provided that includes at least one main wordline, a plurality of sub-wordlines corresponding to the main wordline, a plurality of main memory cells each being coupled to the sub-wordlines, a main wordline selector for activating the main wordline according to an external address, at least one redundancy sub-wordline, a plurality of redundancy sub-wordlines corresponding to the redundancy main wordline, a plurality of redundancy memory cells each being coupled to the redundancy sub-wordlines, a redundancy control circuit for disabling the main wordline selector when among the sub-wordlines, a sub-wordline to which a defective memory cell is coupled is addressed, and for controlling the sub-wordline to be replaced by the redundancy main wordline.

Beneficially, the number of the redundancy sub-wordlines coupled to the redundancy main wordline is smaller than the number of the sub-wordlines coupled to the main wordline. The redundancy control circuit enables the main wordline selector when among the sub-wordlines, a sub-wordline to which a normal main memory cell is coupled is addressed.

In one embodiment the redundancy control circuit has at least fuse circuit that stores a row address of the defective main memory cell and compares the stored address with an externally inputted address. If the addresses match up to each other, the fuse circuit generates a redundancy enable signal. The main wordline selector is enabled/disabled according to the redundancy enable signal.

BRIEF DESCRIPTION OF THE DRAWINGS

FIG. 3A and FIG. 3B illustrate a memory device according to one of more aspects the present invention.

DETAILED DESCRIPTION

A semiconductor memory device (DRAM) disclosed herein includes a plurality of sub-wordlines corresponding to a main wordline, a plurality of sub-wordlines corresponding to a redundancy main wordline, a plurality of redundancy memory cells each being coupled to the redundancy sub-wordlines, and a redundancy control circuit. In addressing a sub-wordline to which a defective memory cell is coupled, the redundancy control circuit disables a sub-wordline selector and controls the sub-wordline to be replaced by the redundancy main wordline. Particularly, because the number of the redundancy sub-wordlines coupled to the redundancy main wordline is smaller than that of the sub-wordlines coupled to the main wordline, redundancy flexibility can be improved and the circuit area can be reduced.

The present invention will now be described more fully hereinafter with reference to accompanying drawings.

Figure 3B:
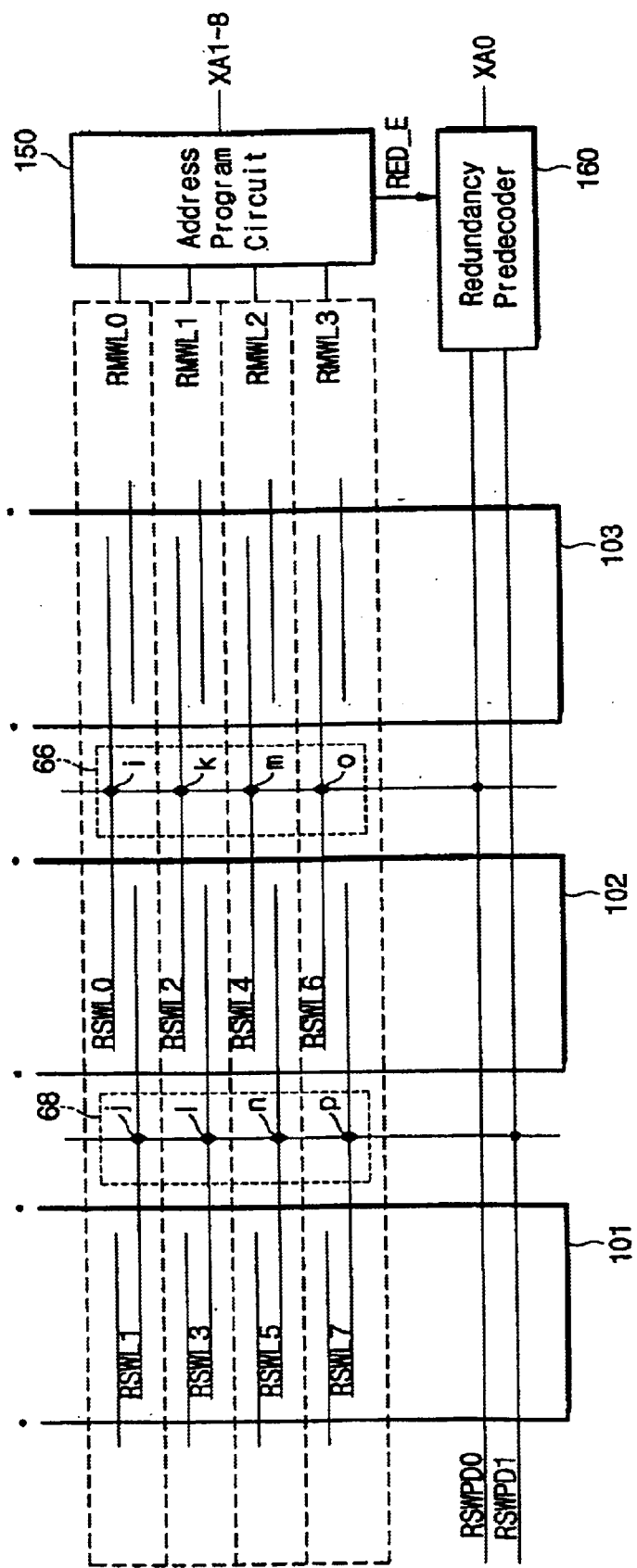

Referring to FIGS. 3A–B, there is illustrated a block diagram of a memory device. The memory device includes memory cell arrays 101, 102, and 103 having a plurality of memory cells, a first predecoder 110, a first main row decoder 120, first main wordlines MWL0–MWL31, second main wordlines MWL32–MWL63, a second predecoder 140, an address program circuit 150, redundancy main wordlines RMWL0–RMWL3, and a redundancy predecoder 160. The first main wordlines MWL0–MWL31 are coupled to the first main row decoder 120 and are horizontally arranged over the memory cell arrays 101, 102, and 103. The second main wordlines MWL32–MWL63 are coupled to the second main row decoder 130 and are horizontally arranged over the memory cell arrays 101, 102, and 103. The redundancy main wordlines RMWL0–RWML3 are coupled to the address program circuit 150 and are horizontally arranged over the memory cell arrays 101, 102, and 103.

The first predecoder 110 activates one of eight predecoding lines SWPD0–SWPD7 according to an external address /XA8. Each of the predecoding lines SWPD0–SWPD7 is horizontally arranged over the memory cell arrays 101, 102, and 103, and is vertically arranged therebetween, connecting each of the corresponding sub-row decoders a–h to one side of the predecoder 110.

The second predecoder 140 activates one of eight predecoding lines SWPD8–SWPD15 according to an external address XA8. Each of the predecoding lines SWPD8–SWPD15 is horizontally arranged over the memory cell arrays 101, 102, and 103, and is vertically arranged therebetween, connecting each of the corresponding sub-row decoders p–w to one side of the predecoder 140. The predecoding lines SWPD0–SWPD7 and SWPD8–SWPD15 are connected to 32 sub-row decoders, respectively. Accordingly, as compared to the prior art where 64 sub-row decoders are connected to one predecoding line, a load of the predecoding line is reduced to enhance a data access speed by a factor of two times or more.

The first main row decoder 120 activates one of the first main wordlines MWL0–MWL31 according to an external row address XA3–XA7. Each of the first main wordlines MWL0–MWL31 is coupled to one side of the first main row decoder 120 and is horizontally arranged over the memory cell arrays 101, 102, and 103. Each of the sub-row decoders a, c, C, and g is disposed between the memory cell arrays 102 and 103, and is coupled to a main wordline through corresponding one of sub-wordlines SW0, SW2, SW4, and SW6 crossing over the memory cell arrays 102 and 103. Each of the sub-row decoders b, d, f, and h is disposed between the memory cell arrays 101 and 102, and is coupled to a main wordline through corresponding one of sub-wordlines SW1, SW3, SW4, and SW7 crossing over the cell arrays 101 and 102.

The second main row decoder 130 activates one of the second main wordlines MWL32–MWL63 according to the external row address XA3–XA7. Each of the second main wordlines MWL32–MWL63 is coupled to one side of the second main row decoder 130, and is horizontally arranged over the memory cell arrays 101, 102, and 103. Each of the sub-row decoders p, r, t, and v is disposed between the memory cell arrays 102 and 103 and is coupled to a main wordline through corresponding one of sub-wordlines SW8, SW10, SW12, and SW14 crossing over the cell arrays 102 and 103. Each of the sub-row decoders q, s, u, and w is disposed between the memory cell arrays 101 and 102, and is coupled to a main wordline through corresponding one of sub-wordlines SW9, SW11, SW13, and SW15.

The address program circuit 150 activates redundancy main wordlines RMWL0–RMWL3 by receiving an external address XA1–XA8 except an external address XA0. The redundancy main wordlines RMWN0–RMWL3 are coupled to one side of the address program circuit 150, and are horizontally arranged over the memory cell arrays, 101, 102 and 103.

The redundancy predecoder 160 activates one of two predecoding lines according to the external row address XA0. Each of predecoding lines RSWPD0–RSWPD1 is horizontally arranged over the cell arrays 101, 102, and 103 and is vertically arranged therebetween, coupling each of corresponding sub-row decoders i–p to one side of the redundancy predecoder 160.

Each of the redundancy sub-row decoders i, k, m, and o is disposed between the memory cell arrays 102 and 103, and couples the redundancy sub-wordlines RSWL0, RSWL2, RSWL4, and RSWL6 to the redundancy main wordlines RMWL0–RMWL3, respectively. Each of the redundancy sub-row decoders j, 1, n, and p is disposed between the memory cell arrays 101 and 102, and couples redundancy sub-wordlines RSWL1, RSWL3, RSWL5, and RSWL7 to the redundancy main wordlines RMWL0–RMWL3, respectively.

According to this embodiment, in controlling the redundancy row decoders i–o, two redundancy sub-wordlines are coupled to each of the redundancy main wordlines and the redundancy predecoder 160 is constructed to be separate from the main predecoders 110 and 140. As a result, redundancy flexibility can be improved.

Figure 1:
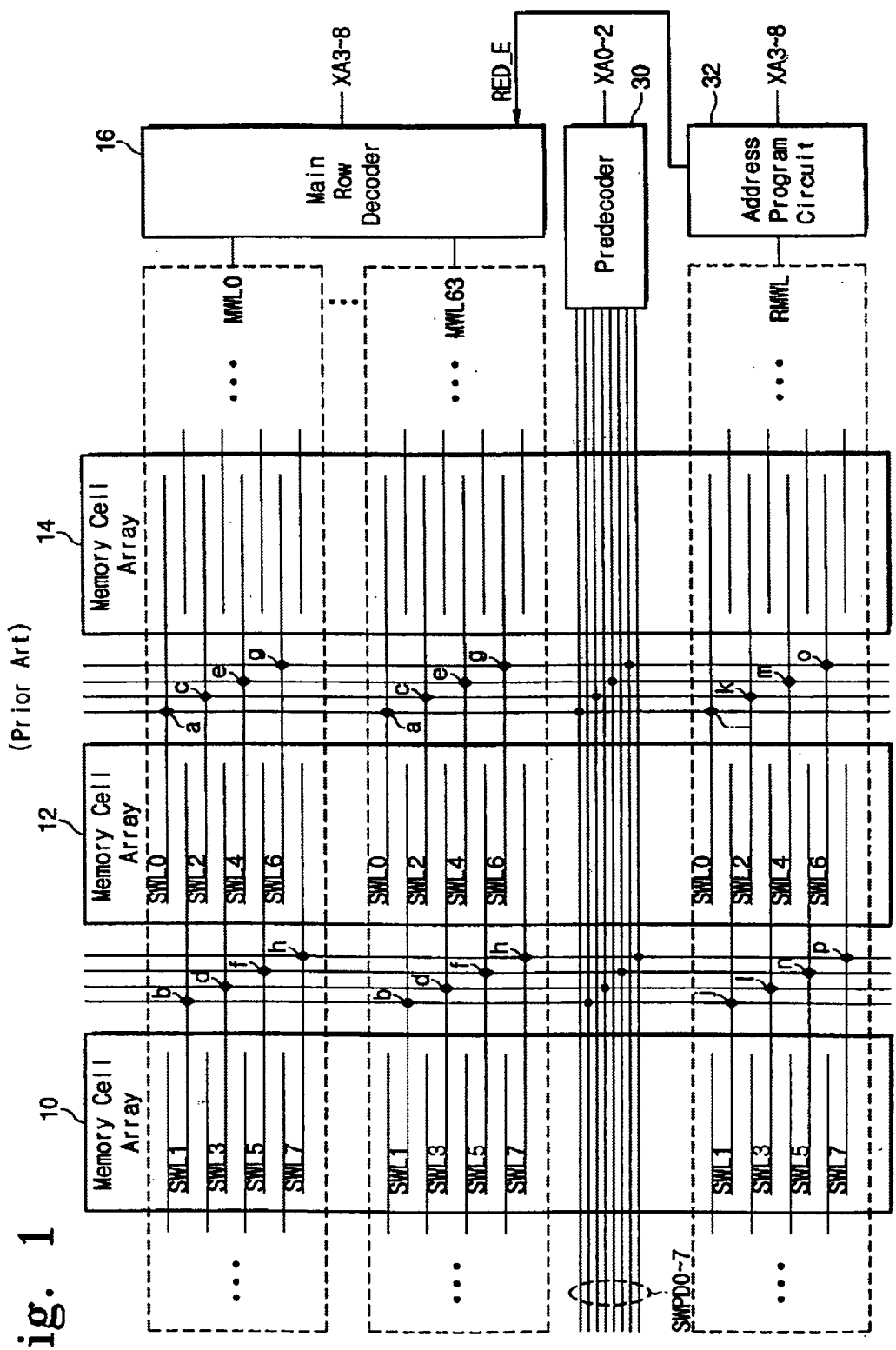
FIG. 1 illustrates a conventional memory device.
Figure 2:
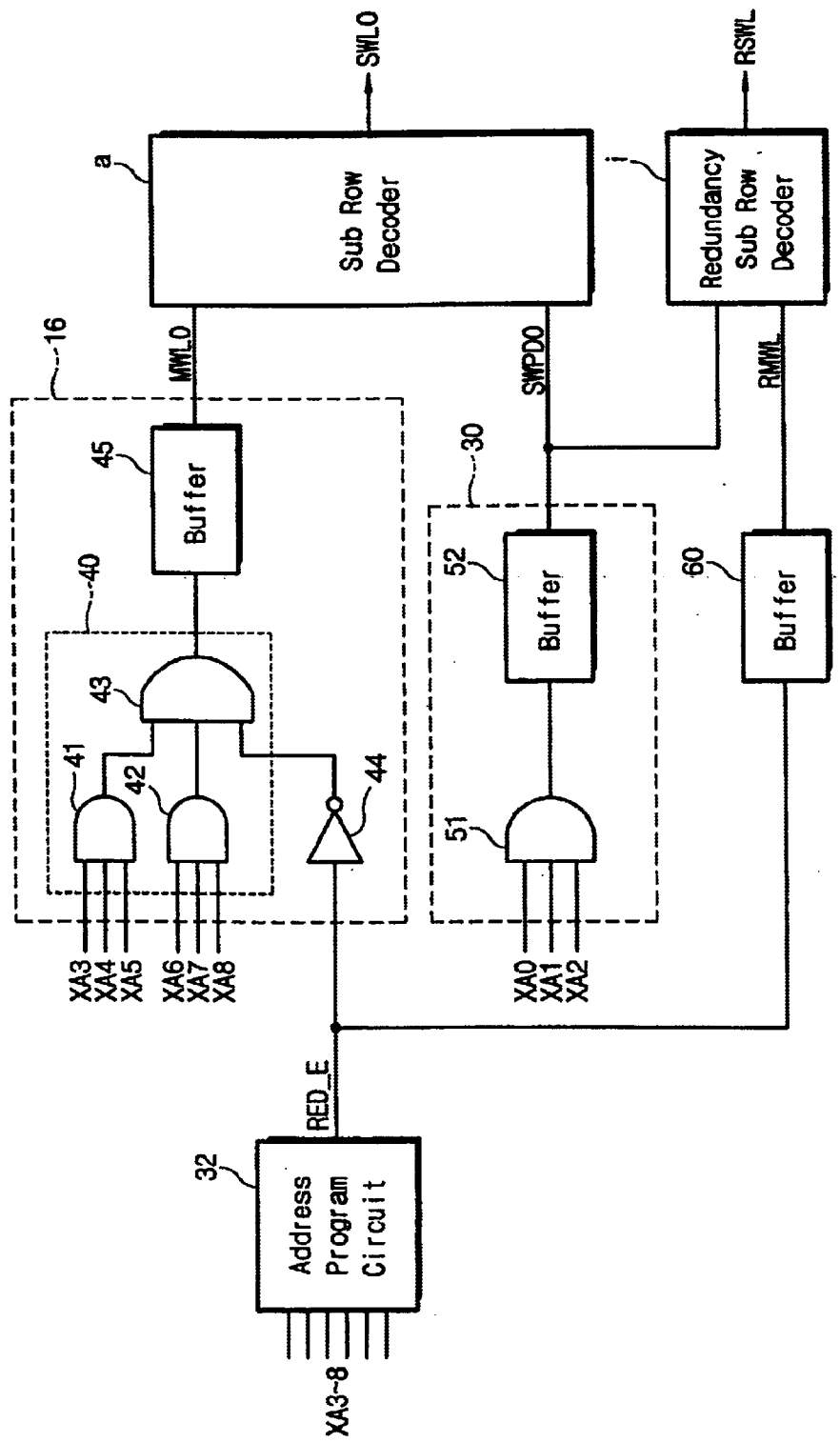
FIG. 2 illustrates circuit constructions associated with a redundancy operation of the memory device shown in FIG. 1.
Figure 4:
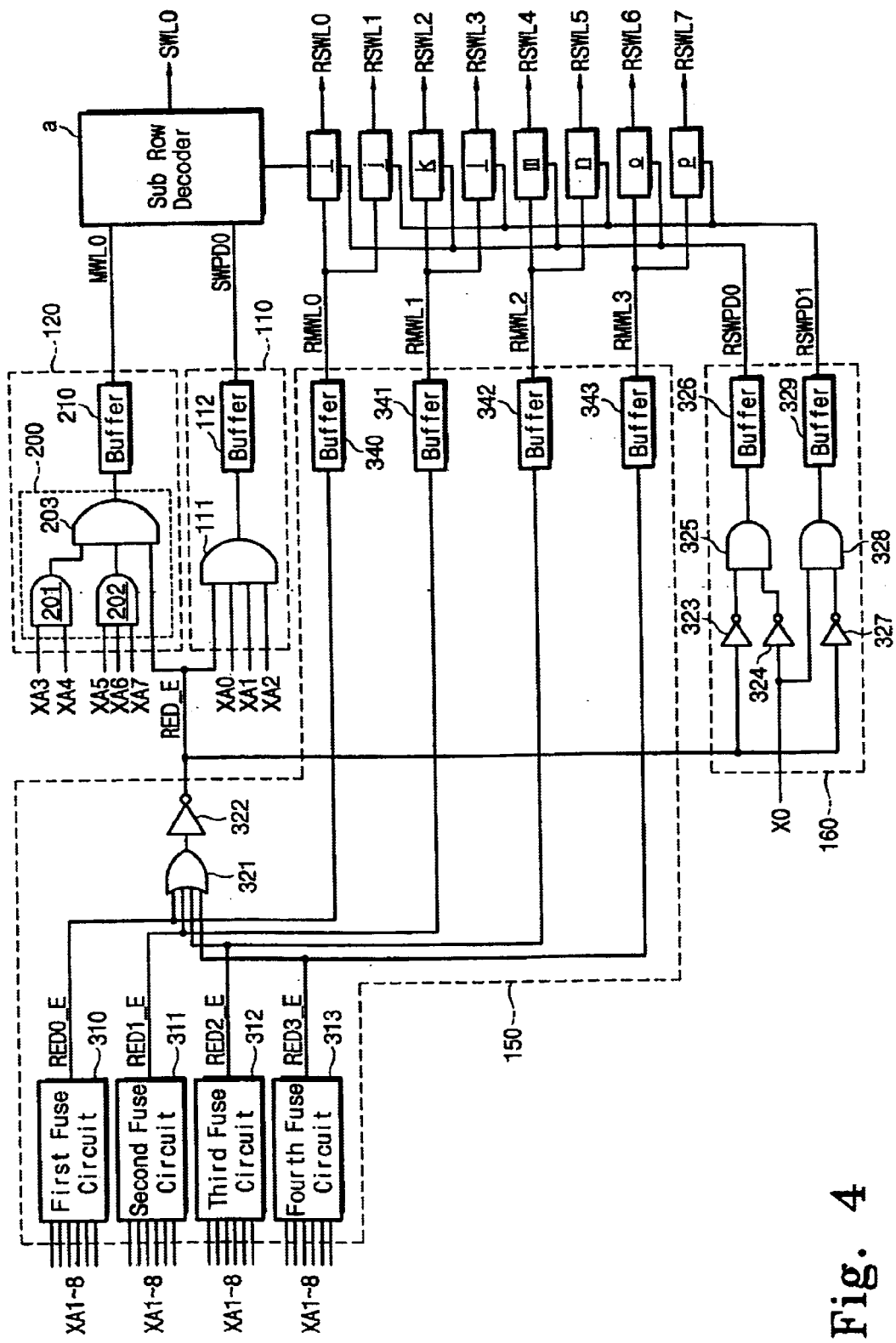
FIG. 4 illustrates circuit constructions associated with a redundancy operation of the memory device shown in FIG. 3A and FIG. 3B.

FIG. 4 illustrates a partial circuit construction of an address program circuit 150 and a redundancy predecoder 160. The first main wordline decoder 120 and the first predecoder 110 are the same as shown in FIG. 2 and will not be explained in further detail.

Referring to FIG. 4, an address program circuit 150 includes four fuse circuits 310–313 for storing an address of a defective cell in memory cell arrays 101, 102, and 103. Different defective addresses may be stored in the fuse circuits 310–313, respectively.

Figure 5:
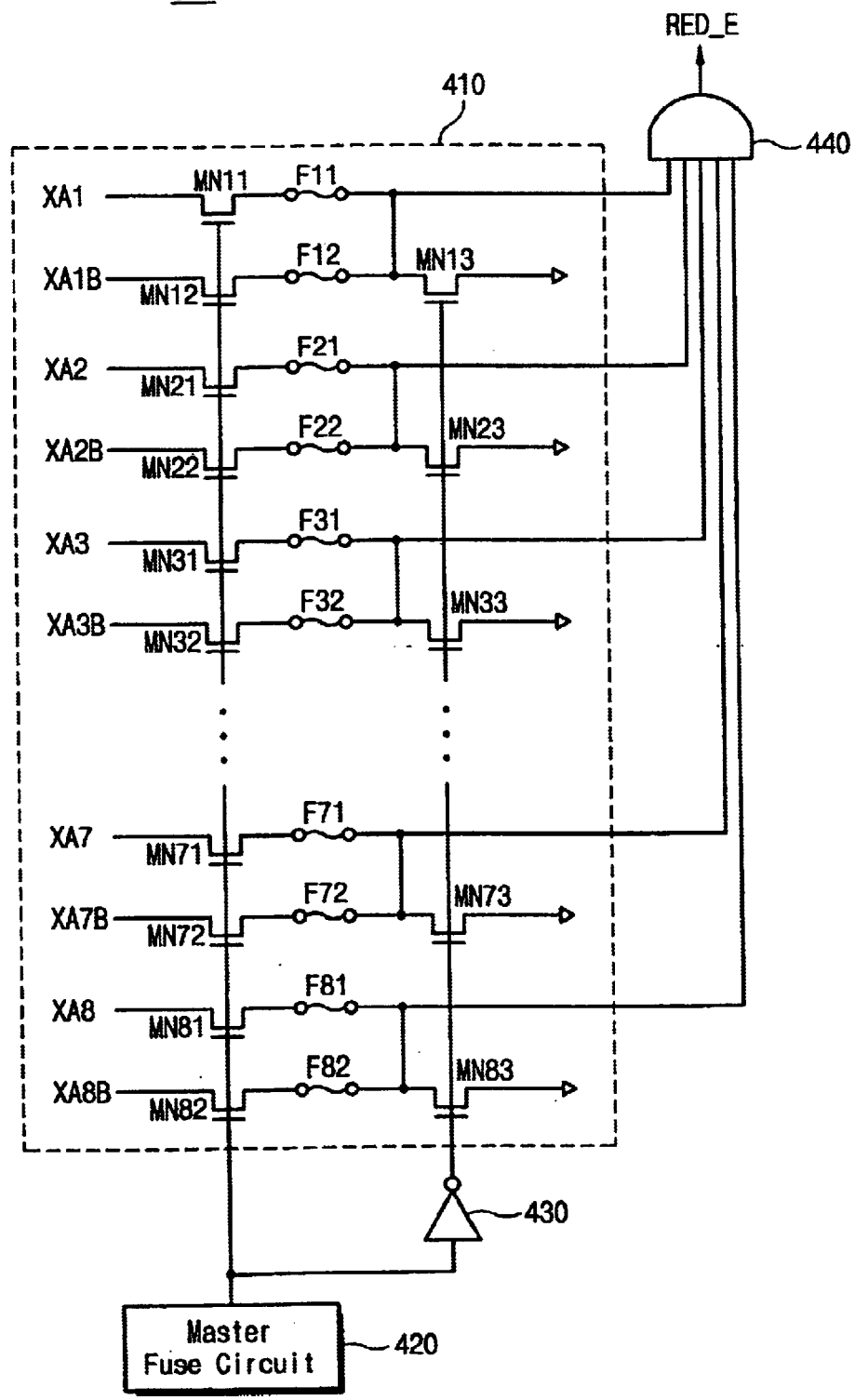
FIG. 5 illustrates a detailed circuit construction of a fuse circuit of FIG. 4.

FIG. 5 illustrates a detailed circuit construction of the fuse circuit 310 shown in FIG. 4. Since the other fuse circuits 311–313 shown in FIG. 4 have the same operation and construction as the fuse circuit 310, only the fuse circuit 310 is illustrated. Unlike a conventional fuse circuit which includes 12 fuses so as to store only 6 bit address XA3–XA8, the fuse circuit 310 of FIG. 5 includes 16 fuses F11–F81 and F12–F82, NMOS transistors MN11–MN81, MN12–MN82, and MN13–MN83 each corresponding to each of the fuses F11–F81 and F12–F82, a master fuse circuit 420, an inverter 430, and a NAND gate 440, so as to store an 8 bit address XA1–XA8. The detailed operations of the fuse circuit 310 are well known to a person skilled in the art, and will not be explained in further detail.

Returning to FIG. 4, the fuse circuits 310–313 each compare an external row address XA1–XA8 with a defective address stored therein. If they match up to each other, then a corresponding one of the fuse circuits 310–313 outputs a signal RED0_E . . . RED3_E having a high level (i.e., logic '1'), respectively.

A signal output from a NOR gate 321 becomes high when at least one of the signals RED0_E-RED3_E is high. Therefore, a redundancy enable signal RED_E output from an inverter 322 becomes low. As a result, first and second main row decoders 120 and 130, as well as first and second predecoders 110 and 140 are disabled, and the redundancy predecoder 160 is enabled.

Buffers 340–343 in address program circuit 150 convert levels of the signals RED0_E-RED3_E into levels suitable for driving redundancy wordlines RMWL0–RMWL3 and output the signals RED0_E-RED3_E having the suitable levels, respectively. According to this construction, a redundancy main wordline corresponding to a fuse storing an address matching up to external row address XA1–XA8 is activated.

Redundancy predecoder 160 includes inverters 323, 324, and 327, AND gates 325 and 328, and buffers 326 and 329. The inverters 323 and 324 receive and invert a redundancy enable signal RED_E and an external address X0. The AND gate 325 receives output signals of the inverters 323 and 324 to perform an AND operation. The inverter 327 receives and inverts the redundancy enable signal RED_E, and the AND gate 328 receives an output signal of the inverter 327 and the external address X0 to perform an AND operation. The buffers 326 and 329 convert levels of signals output from corresponding AND gates 325 and 328 into levels suitable for driving redundancy predecoding lines RSWPD0–RSWPD1, and output the signals having the suitable level, respectively. Thus, when the external address X0 is '0', the redundancy predecoding line RSWPD0 is activated. When the external address X0 is '1', the redundancy predecoding line RSWPD1 is activated.

For example, assume that a defect exists in a memory cell coupled to a sub-wordline SWL0 whose row address is '000000000' and an address of the defective cell is stored in a second fuse circuit 311. When an externally supplied row address XA1–XA8 is '00000000', a signal RED1_E output from the second fuse circuit 311 becomes high, and signals RED0_E, RED2_E, and RED3_E output from the other fuse circuits 310, 312, and 313 become low. Therefore, the redundancy enable signal RED_E becomes low. As a result, the first and second main row decoders 120 and 130, as well as the first and second predecoders 110 and 140, are disabled. On the other hand, a first redundancy main wordline RMWL1 is activated by the signal RED1_E output from the second fuse circuit 311. Since the external row address X0 is '0', the redundancy predecoding line RSWPD0 is activated. Thus, a redundancy sub-row decoder k is activated to replace the sub-wordline SWL0 by a redundancy sub-wordline RSWL2.

In the exemplary case of the defective cell coupled to the sub-wordline SWL0 whose row address is '000000000', when a row address '000000001' is externally supplied (i.e., the sub-wordline SWL1 is addressed), operations of the memory device are described below. Since the upper 8 bits '00000000' of an external input address matches up to the 8 bit address '00000000' stored in the second fuse circuit 311, the signal RED I_E becomes high, and signals RED0_E, RED2_E, and RED3_E output from the other fuse circuits 310, 312, and 313 become low. As a result, a first redundancy main wordline RMWL1 is activated. Since the lowest bit X0 of the external row address is '1', the predecoding line RSWPD1 is activated. Thus, the redundancy sub-row decoder "1" is activated to replace the sub-wordline SWL1 by a redundancy sub-wordline RSWL3.

In conclusion, when the upper 8 bits of an externally supplied address match up to an address of a defective cell stored in fuse circuits 310–313, a sub-wordline corresponding to the row address is replaced by a redundancy sub-wordline. That is, when there is a sub-wordline to which a defective cell is coupled among 8 sub-wordlines corresponding to one main wordline, 8 sub-wordlines are all replaced by sub redundancy wordlines in the prior art. In contrast, a first sub-wordline to which a defective cell is coupled, and another sub-wordline whose lowest bit is different from that of the first sub-wordline, are replaced by two redundancy sub-wordlines in the embodiment disclosed above. Particularly, when among sub-wordlines coupled to a main wordline, a sub-wordline to which a normal main memory cell is addressed, a main wordline selector is enabled to improve a redundancy flexibility and to reduce a circuit area.

While the invention has been described with respect to certain preferred embodiments and examples, it is not intended to limit the scope of the claims thereby, but solely by the claims appended hereto.

What is claimed is:

1. A semiconductor memory device comprising:

a main wordline;

a plurality of sub-wordlines corresponding to the main wordline;

a plurality of main memory cells each being coupled to one of the sub-wordlines;

a sub-wordline selector for activating at least one of the sub-wordlines based on a first external address;

a main wordline selector for activating the main wordline based on a second external address;

at least one redundancy main wordline;

a plurality of redundancy sub-wordlines corresponding to the redundancy main wordline;

a plurality of redundancy memory cells each being coupled to one of the redundancy sub-wordlines; and a redundancy control circuit for disabling the main wordline selector when among the sub-wordlines, a sub-wordline to which a defective memory cell is coupled is addressed, and for controlling the sub-wordline to be replaced by the redundancy main wordline, wherein the number of the redundancy sub-wordlines coupled to the redundancy main wordline is smaller than the number of the sub-wordlines coupled to the main wordline; and wherein the redundancy control circuit enables the main wordline and sub-wordline selectors when among the sub-wordlines, a sub-wordline to which a normal main memory cell is coupled is addressed.

2. The semiconductor memory device of claim 1, wherein the redundancy control circuit includes at least one fuse circuit for storing a row address of the defective main memory cell, comparing the stored address with an externally inputted address, and activating a redundancy enable signal when the stored address and the externally inputted address match each other.

3. The semiconductor memory device of claim 2, wherein the main wordline and sub-wordline selectors are enabled when the redundancy enable signal is inactive, and are disabled when the redundancy enable signal is active.

4. The semiconductor memory device of claim 2, wherein the redundancy control circuit further includes:

a plurality of redundancy sub-row decoders for coupling each of the redundancy sub-wordlines to each of the redundancy main wordlines; and a redundancy predecoder for activating one of the redundancy sub-row decoders based on a part of the first external address when the redundancy enable signal is active.

5. The semiconductor memory device of claim 1, further comprising a second main wordline.

6. The semiconductor memory device of claim 5, further comprising:

a second plurality of sub-wordlines corresponding to the second main wordline;

a second plurality of main memory cells each being coupled to one of the second sub-wordlines;

a second sub-wordline selector for activating at least one of the second sub-wordlines based on the first external address.

7. A semiconductor memory device comprising:

a main wordline;

a plurality of sub-wordlines corresponding to the main wordline;

a plurality of main memory cells each being coupled to each of the sub-wordlines;

a sub-wordline selector for activating at least one of the sub-wordlines based on a first external address;

a main wordline selector for activating the main wordline based on a second external address;

at least one redundancy main wordline;

a plurality of redundancy sub-wordlines corresponding to the redundancy main wordline;

a plurality of redundancy memory cells each being coupled to each of the redundancy sub-wordlines; and a redundancy control circuit for disabling the main wordline selector when among the sub-wordlines, a sub-wordline to which a defective memory cell is coupled is addressed, and for controlling the sub-wordline to be replaced by the redundancy main wordline, wherein the number of the redundancy sub-wordlines coupled to the redundancy wordline is smaller than the number of the sub-wordlines coupled to the main wordline;

wherein the redundancy control circuit enables the main wordline and sub-wordline selectors when among the sub-wordlines, a sub-wordline to which a normal main memory cell is coupled is addressed; and wherein the redundancy control circuit includes, at least one fuse circuit for storing a row address of the defective main memory cell, comparing the stored address with an externally inputted address, and activating a redundancy enable signal when the stored address and the externally inputted address match each other, a plurality of sub-row decoders for coupling each of the redundancy sub-wordlines to each of the redundancy main wordlines, and a redundancy predecoder for activating one of the row redundancy sub-row decoders based on a part of the first external address when the redundancy enable signal is active.

8. The semiconductor memory device of claim 7, further comprising a second main wordline.

9. The semiconductor memory device of claim 8, further comprising:

a second plurality of sub-wordlines corresponding to the second main wordline;

a second plurality of main memory cells each being coupled to one of the second sub-wordlines;

a second sub-wordline selector for activating at least one of the second sub-wordlines based on the first external address.

* * * * *